US005576574A

United States Patent [19]
Hong

[11] Patent Number: 5,576,574
[45] Date of Patent: Nov. 19, 1996

[54] MOSFET WITH FULLY OVERLAPPED LIGHTLY DOPED DRAIN STRUCTURE AND METHOD FOR MANUFACTURING SAME

[75] Inventor: Gary Hong, Hsinchu, Taiwan

[73] Assignee: United Microelectronics Corporation, Hsinchu, Taiwan.

[21] Appl. No.: 497,521

[22] Filed: Jun. 30, 1995

[51] Int. Cl.⁶ .......................... H01L 29/76; H01L 21/265
[52] U.S. Cl. .............................. 257/408; 257/900; 437/40
[58] Field of Search .................................. 257/408, 900; 437/40

[56] References Cited

U.S. PATENT DOCUMENTS

| | | | |
|---|---|---|---|
| 5,162,884 | 11/1992 | Liou et al. | 257/900 |
| 5,182,619 | 1/1993 | Pfiester | 257/900 |
| 5,241,203 | 8/1993 | Hsu et al. | 257/408 |
| 5,355,011 | 10/1994 | Takata | 257/408 |
| 5,418,392 | 5/1995 | Tanabe | 257/408 |
| 5,471,080 | 11/1995 | Satoh et al. | 257/408 |

*Primary Examiner*—Mark V. Prenty
*Attorney, Agent, or Firm*—Townsend and Townsend and Crew LLP

[57] ABSTRACT

A MOSFET with a fully overlapped LDD (lightly doped drain) structure, and the manufacturing method for the MOSFET, are disclosed. The MOSFET has a first type of semiconductor material having a source and a drain, respectively, constructed of a second type of lightly doped regions and heavily doped regions, and a channel region between the source and the drain; a gate insulator formed over the channel region and the second type of lightly doped regions; and a gate including a first conductive layer and a second conductive layer. The first conductive layer is formed over the gate insulator and the second conductive layer is formed over the first conductive layer above the channel region.

8 Claims, 5 Drawing Sheets

MOSFET WITH FULLY OVERLAPPED LIGHTLY DOPED DRAIN STRUCTURE AND METHOD FOR MANUFACTURING SAME

BACKGROUND OF THE INVENTION

1. Field of the invention

This invention generally relates to a MOSFET (Metal-Oxide-Semiconductor Field Effect Transistor) and a method for manufacturing it. In particular, this invention relates to a MOSFET with a fully overlapped LDD (Lightly Doped Drain) structure and a method for manufacturing it, which allows the MOSFET to be made smaller than is possible by conventional manufacturing techniques while providing improved performance.

2. Description of the prior art

As the dimensions of integrated circuits are scaled down into the submicron range, the reliability of MOSFET devices is increasingly affected by the electron effect or punch-through effect, which are important problems that must be solved. Accordingly, a MOSFET with an LDD structure is disclosed. A conventional manufacturing method for the MOSFET comprises the following steps:

(1) Referring to FIG. 1a, a gate oxide 100 and a polysilicon layer 102 are sequentially formed on a substrate 1, and being defined on a channel region of the MOSFET to form a gate 10 thereof.

(2) Referring to FIG. 1b, a dopant such as arsenic is doped into the substrate 1 by using the gate 10 as a mask to form lightly doped regions 12a and 12b.

(3) As shown in FIG. 1c, sidewall spacers 120a and 120b are formed on the sidewalls of the gate 10. For instance, an oxide layer is first deposited thereon, and which is then etched back in a plasma etching step to form the spacers 120a and 120b.

(4) Referring to FIG. 1d, a dopant is doped into the substrate 1. Heavily doped regions 14a and 14b are thereby formed under the sidewall spacers 120a, 120b and the gate 10. The heavily doped regions 14a and 14b in combination with the remaining lightly doped regions 12a and 12b respectively form the drain and the source of the MOSFET.

However, as the dimensions of the MOSFET devices are scaled down, the channel region of the MOSFET between the drain and the source is also shortened. Furthermore, the ratio of the lightly doped region to the channel region becomes greater. This causes a deterioration of the performance of the MOSFET because the resistance of the lightly doped region is larger than that of the heavily doped region. In addition, the punchthrough effect caused by the scaled-down dimensions deters the normal operation of the MOSFET device.

SUMMARY OF THE INVENTION

It is therefore an object of the present invention to provide an improved architecture of a MOSFET which overcomes the drawbacks and disadvantages associated with the aforementioned MOSFET with LDD structure.

Another object of the present invention is to provide a method for manufacturing a MOSFET with a fully overlapped LDD structure.

Still another object of the present invention is to provide a MOSFET which permits the manufacture of devices which are smaller than devices made by conventional manufacturing techniques.

Various other objects, advantages and features of the present invention will become readily apparent from the ensuing detailed description, and the novel features will be particularly pointed out in the appended claims.

BRIEF DESCRIPTION OF THE DRAWINGS

Other objects and further features of the present invention will become more apparent from the following detailed description when read in conjunction with the accompanying drawings.

DESCRIPTION OF THE PREFERRED EMBODIMENTS

The method for manufacturing a MOSFET with a fully overlapped LDD structure in accordance with the invention is capable of making MOSFETs on a first type of semiconductor material 2 such as a p-type substrate, an n-type substrate, a p well on an n-doped substrate, or an n well on a p-doped substrate. In the described embodiment of the invention, the MOSFET is manufactured on a p-type substrate. This manufacturing method comprises the following steps:

STEP 1

Figure 1A:
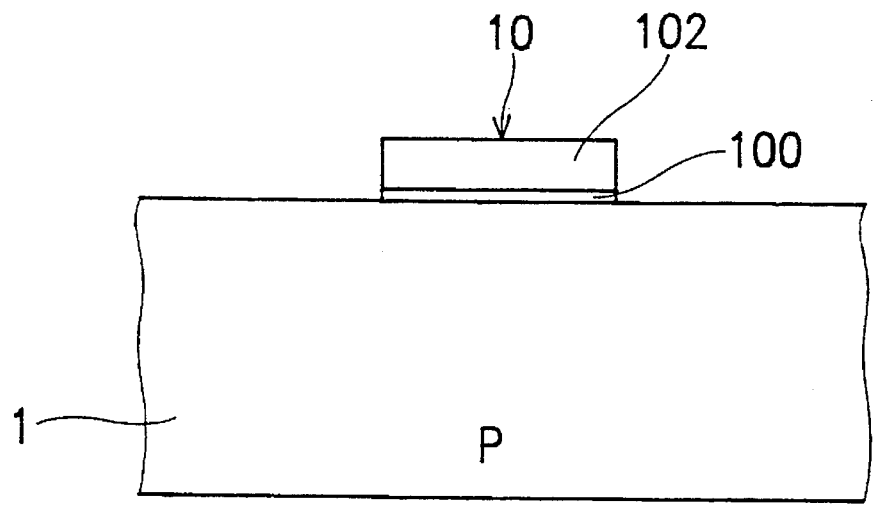
FIGS. 1a–1d schematically illustrate diagrams of conventional manufacturing procedures for a MOSFET with a lightly doped drain structure.
Figure 1B:
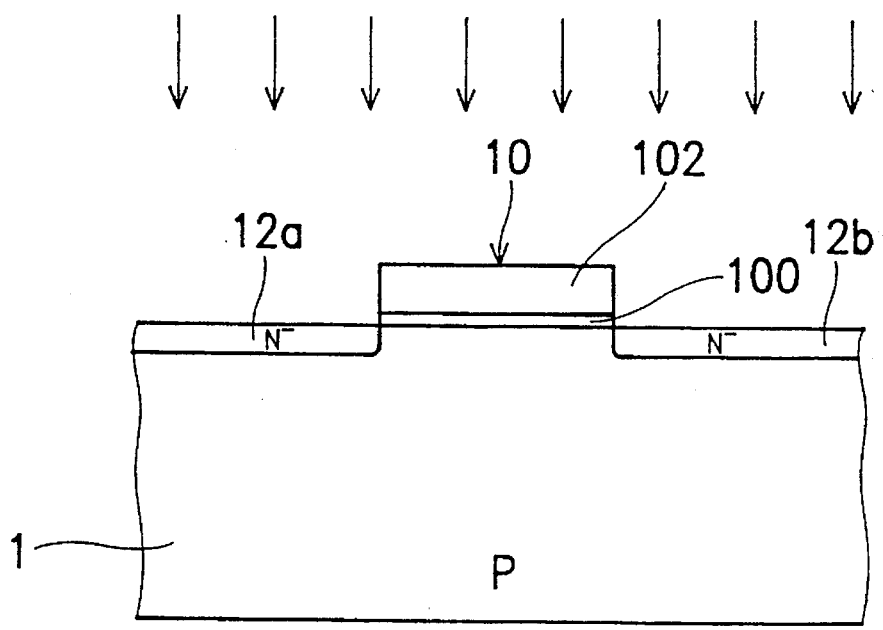
Figure 1C:
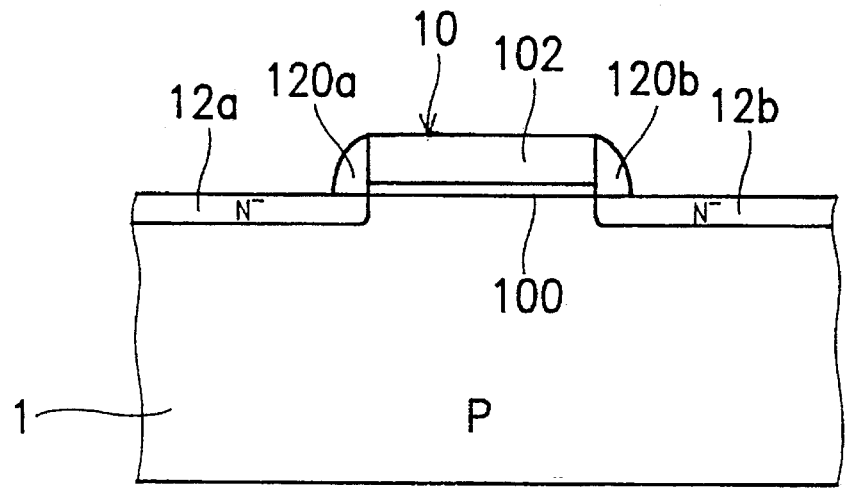
Figure 1D:
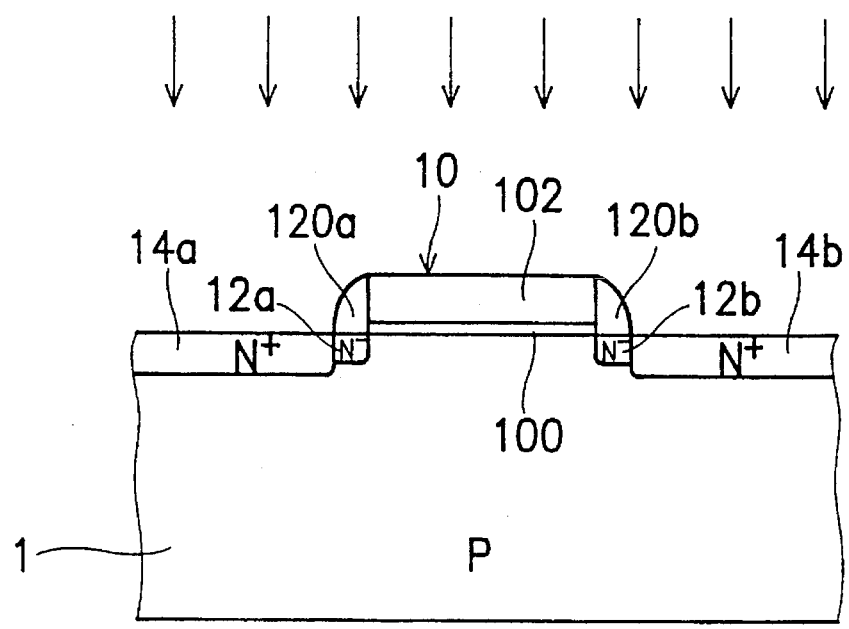
Figure 2A:
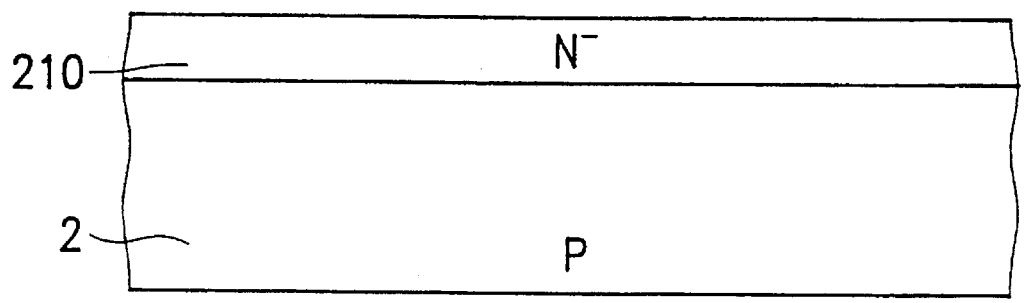
FIGS. 2a–2f schematically illustrate manufacturing procedures for a MOSFET with a fully overlapped, lightly doped/drain structure according to the present invention.

Referring to FIG. 2a, a second type of dopant such as phosphorus is doped into the first type of semiconductor material 2 to form a second type of lightly doped region 210. The implantation energy is about 50 KeV and the dose of the dopant is about $2E13/cm^2$.

STEP 2

Figure 2B:
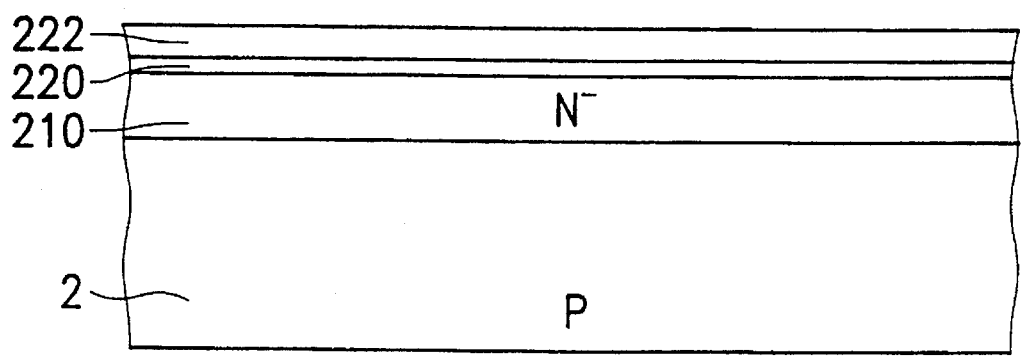

Referring to FIG. 2b, a gate insulator 220 and a first conductive layer 222 are sequentially formed on the semiconductor material 2. For example, a gate oxide layer is first grown on the substrate to a thickness of about 100 Å, and a polysilicon layer with a thickness of about 300 Å to 1000 Å is then deposited thereon. The polysilicon is doped to lower its resistance.

STEP 3

Figure 2C:
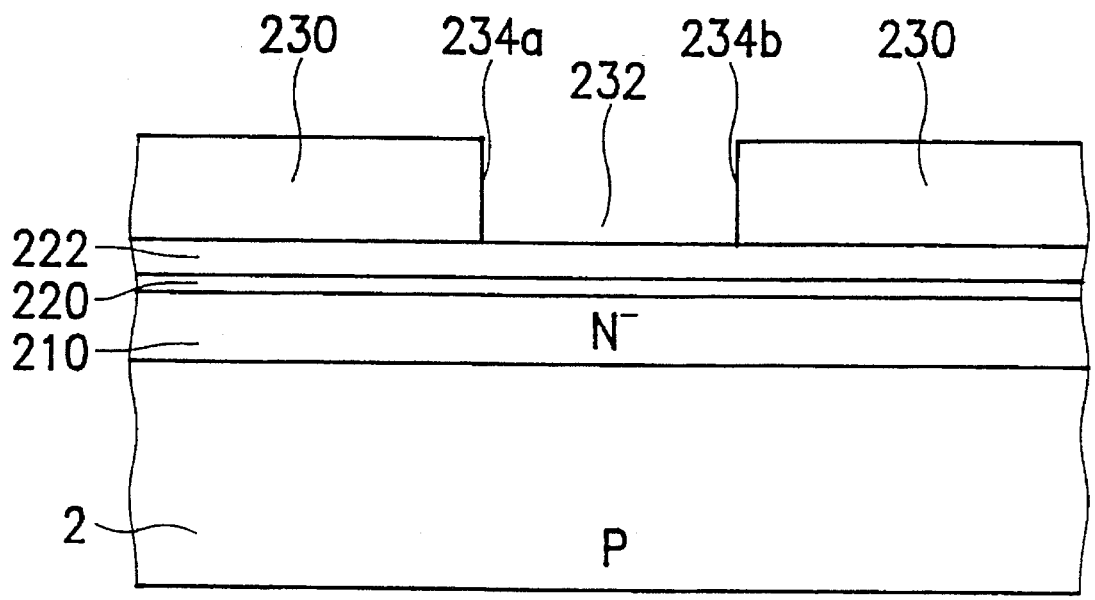

Referring to FIG. 2c, a masking layer 230 such as nitride is deposited over the first conductive layer 222 by CVD (Chemical Vapor Deposition). The thickness of the masking layer 230 is about 2000 Å to 5000 Å. Furthermore, the masking layer 230 is provided with an opening 232 to define a channel region of the MOSFET. The opening 232 can be made on the masking layer 230 by photolithography and etching.

STEP 4

Figure 2D:
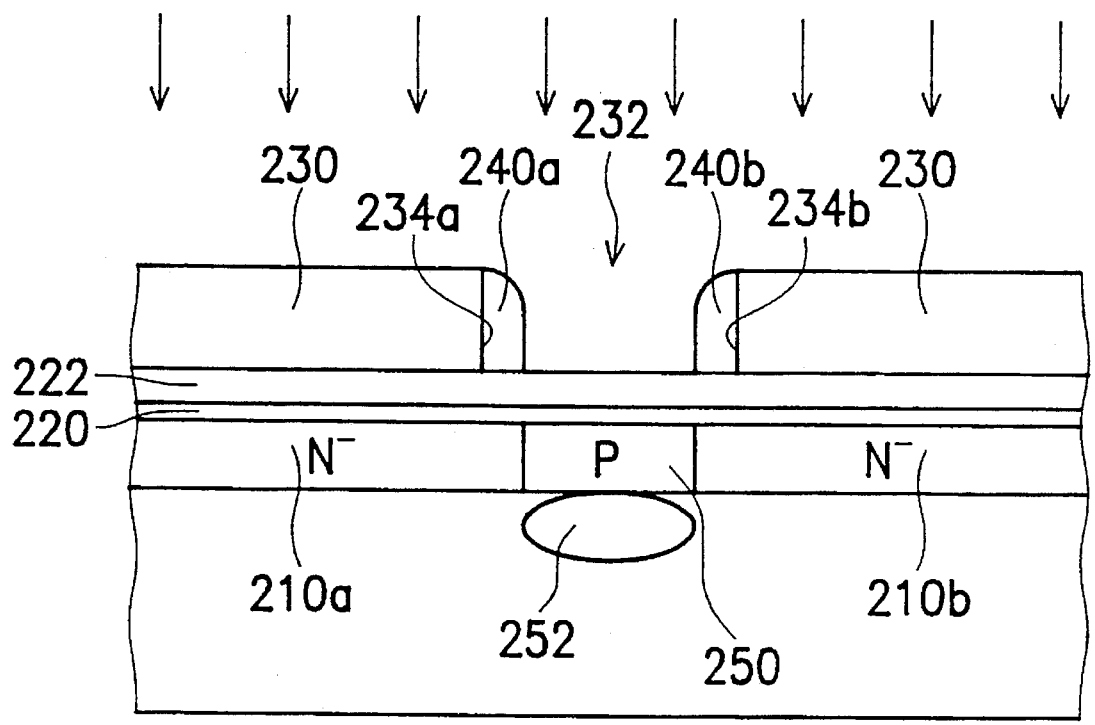

Referring now to FIG. 2d, sidewall spacers 240a and 240b are formed on sidewalls 234a and 234b of opening 232. Then, using masking layer 230 and sidewall spacers 240a, 240b as a mask, a first type of dopant is doped into the second type of lightly doped region 210 to form the channel region 250 of the MOSFET. The sidewall spacers 240a and 240b can be oxide deposited by CVD with a thickness of about 500 Å to 2000 Å and etched back. The dopant can be boron, for example, with a dose about $1E13/cm^2$ to $3E13/cm^2$, and the implantation energy should be about 30 KeV. Moreover, the dopant can be implanted with a higher energy, such as 150 KeV, and a dose of about $5E12/cm^2$ to form an anti-punchthrough region 252 (also referred to as punch-through stopper) under the channel region 250.

STEP 5

Figure 2E:
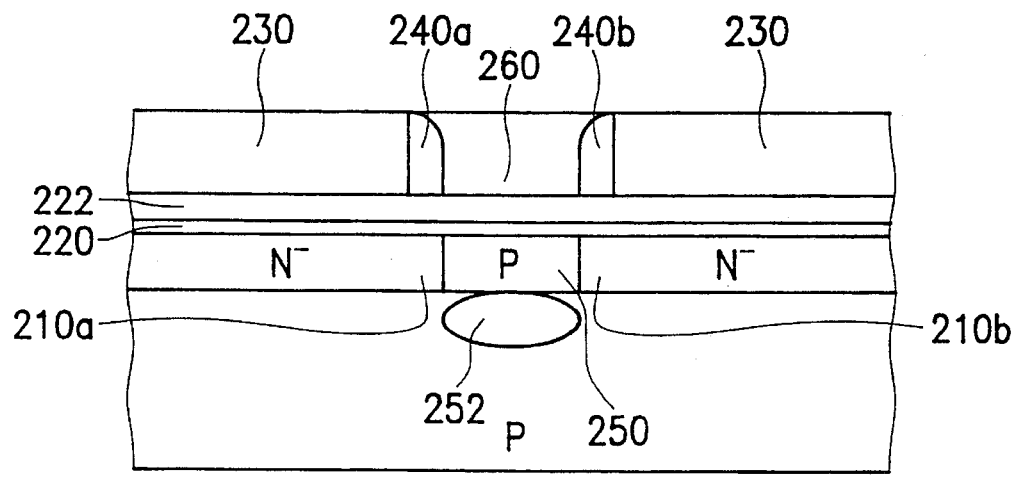

Referring to FIG. 2e, a second conductive layer 260 is formed between the sidewall spacers 240a and 240b on the first conductive layer 222. The second conductive layer 260 can be formed by depositing a layer of polysilicon and doping the polysilicon layer with a dopant to lower its resistance.

STEP 6

Figure 2F:
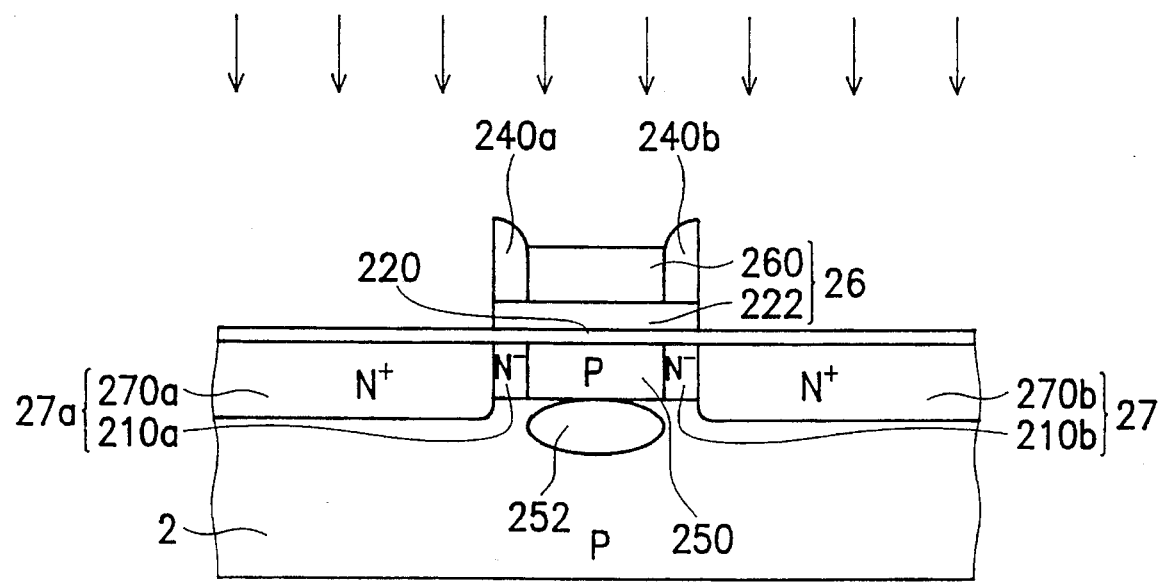

Referring to FIG. 2f, the masking layer 230 is first removed. Thereafter, the portions of the first conductive layer 222 not positioned under the second conductive layer or sidewall spacers 240a, 240b are removed so that the second conductive layer 260 and the remaining first conductive layer 222 define a gate 26 of the MOSFET.

A second type of dopant such as arsenic is then doped into the first type of semiconductor material 2 by using the gate 26 as a mask to form a second type of heavily doped regions 270a and 270b, whereby the second type of heavily doped regions 270a and 270b in combination with the second type of lightly doped regions 210a and 210b under the gate 26 form a source 27a and a drain 27b, respectively, of the MOSFET. The dose of the second type of dopant is about $3E15/cm^2$ and the implantation energy is about 50 KeV.

Referring still to FIG. 2f, the MOSFET with a fully overlapped, lightly doped drain structure of the present invention comprises a first type of semiconductor material 2 having a source 27a and a drain 27b which, respectively, are formed by the second type of lightly doped regions 210a, 210b and the heavily doped regions 270a and 270b. A channel region 250 is defined between the source 27a and the drain 27b; a gate insulator 220 is formed over the channel region 250 and the second type of lightly doped regions 210a, 210b; and the MOSFET has a gate 26, formed by first and second conductive layers 222, 260, in which the first conductive layer 222 is formed on gate insulator 220 and the second conductive layer 260 is formed on the first conductive layer 222 above the channel region 250. Furthermore, an anti-punchthrough region 252 can be formed under the channel region 250.

The gate insulator 220 can be formed by oxide on the second type of lightly doped regions 210a, 210b and the channel region 250.

In addition, sidewall spacers 240a, 240b, made of oxide, for example, are formed on the sidewalls of the second conductive layer 260 and on the first conductive layer 222 above the second type of lightly doped regions 210a and 210b.

Thus, the MOSFET of the present invention has a fully overlapped, lightly doped drain structure.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereof.

What is claimed is:

1. A method for manufacturing a MOSFET with a fully overlapped lightly doped drain structure which is manufactured on a first type of semiconductor material, the method comprising the steps of:

doping a second type of dopant into the first type of semiconductor material to form a second type of lightly doped region;

sequentially forming a gate insulator and a first conductive layer on the first type of semiconductor material;

forming a masking layer on the first conductive layer, the masking layer being formed with an opening defining a channel region of the MOSFET;

forming sidewall spacers on sidewalls of the opening;

doping a first type of dopant into the second type of lightly doped region to form the channel region by using the masking layer and the sidewall spacers as a mask;

forming a second conductive layer on the first conductive layer and between the sidewall spacers;

removing the masking layer;

removing a portion of the first conductive layer not positioned under the second conductive layer and the sidewall spacers so that the second conductive layer and a remainder of the first conductive layer define a gate of the MOSFET; and doping a second type of dopant into the first type of semiconductor material by using the gate as a mask to form a second type of heavily doped regions;

whereby the second type of heavily doped regions combined with the second type of lightly doped regions under the gate form a source and a drain, respectively, of the MOSFET.

2. The method as claimed in claim 1 further comprising, prior to forming the channel region, the step of doping a first type of dopant into the first type of semiconductor material to form an anti-punchthrough region by using the masking layer and the sidewall spacers as masks.

3. The method as claimed in claim 2 wherein the gate insulator and the sidewall spacer are formed of an oxide, and the masking layer is formed of nitride.

4. The method as claimed in claim 3 wherein the first conductive layer and the second conductive layer are formed of polysilicon.

5. The method as claimed in claim 4 including the step of using the first type of semiconductor material as a substrate.

6. The method as claimed in claim 4 including the step of defining a well region on a substrate with the first type of semiconductor material.

7. The method as claimed in claim 5 wherein the first type is defined as p-type and the second type is defined as n-type.

8. The method as claimed in claim 5 wherein the first type is defined as n-type and the second type is defined as p-type.

* * * * *